United States Patent
Tsumagari et al.

(10) Patent No.: US 11,522,443 B2
(45) Date of Patent: Dec. 6, 2022

(54) INVERTER APPARATUS

(71) Applicant: KABUSHIKI KAISHA YASKAWA DENKI, Kitakyushu (JP)

(72) Inventors: Ryosuke Tsumagari, Kitakyushu (JP); Shigekatsu Nagatomo, Kitakyushu (JP); Yuto Kubo, Kitakyushu (JP); Yuki Tokimatsu, Kitakyushu (JP)

(73) Assignee: KABUSHIKI KAISHA YASKAWA DENKI, Kitakyushu (JP)

( * ) Notice: Subject to any disclaimer, the term of this patent is extended or adjusted under 35 U.S.C. 154(b) by 235 days.

(21) Appl. No.: 16/907,309

(22) Filed: Jun. 22, 2020

(65) Prior Publication Data

US 2020/0321858 A1    Oct. 8, 2020

Related U.S. Application Data

(63) Continuation of application No. PCT/JP2017/046954, filed on Dec. 27, 2017.

(51) Int. Cl.
 *H05K 1/14* (2006.01)
 *H02M 1/44* (2007.01)
 (Continued)

(52) U.S. Cl.
 CPC .............. *H02M 1/44* (2013.01); *H01R 12/75* (2013.01); *H02M 7/003* (2013.01); *H02M 7/44* (2013.01);
 (Continued)

(58) Field of Classification Search
 CPC ............. H05K 1/14; H05K 1/141–144; H05K 2201/1006; H05K 2201/10189; H02M 1/44; H02M 7/003; H02M 7/44; H02M 7/1432
 (Continued)

(56) References Cited

U.S. PATENT DOCUMENTS

| 4,908,738 A | 3/1990 | Kobari et al. |
| 5,091,823 A * | 2/1992 | Kanbara ............ H05K 7/20927 361/736 |

(Continued)

FOREIGN PATENT DOCUMENTS

| JP | 2-290099 | 11/1990 |
| JP | 6-303779 | 10/1994 |

(Continued)

OTHER PUBLICATIONS

International Search Report for corresponding International Application No. PCT/JP2017/046954, dated Feb. 6, 2018.

(Continued)

*Primary Examiner* — Tuan T Dinh
(74) *Attorney, Agent, or Firm* — Mori & Ward, LLP

(57) ABSTRACT

An inverter apparatus includes a main circuit substrate, an EMC filter substrate, a control substrate, and a panel. The main circuit substrate is configured to convert electric power and includes an output terminal through which the electric power is output from the inverter apparatus. The EMC filter substrate is provided on the main circuit substrate and configured to reduce propagation of electromagnetic noise. The EMC filter substrate includes a first input terminal through which the electric power is input to the inverter apparatus. The control substrate is provided on the EMC filter substrate so that the EMC filter substrate is sandwiched between the main circuit substrate and the control substrate. The control substrate is configured to control the main circuit substrate. The panel is provided on the control substrate so that the control substrate is sandwiched between the EMC filter substrate and the panel.

12 Claims, 7 Drawing Sheets

(51) Int. Cl.
 *H01R 12/75* (2011.01)
 *H02M 7/00* (2006.01)
 *H02M 7/44* (2006.01)

(52) U.S. Cl.
 CPC ..... *H05K 1/144* (2013.01); *H05K 2201/1006* (2013.01); *H05K 2201/10189* (2013.01); *H05K 2201/2036* (2013.01)

(58) Field of Classification Search
 USPC ................ 361/752–753, 807–811, 816, 818; 439/76.2
 See application file for complete search history.

(56) References Cited

U.S. PATENT DOCUMENTS

| 7,351,911 B2* | 4/2008 | Chiriku | ................ H05K 1/0203 361/679.55 |
| 2014/0240946 A1* | 8/2014 | Fukumasu | ............. B60L 58/20 361/811 |
| 2016/0037654 A1* | 2/2016 | Kosuga | ................. H02M 7/003 361/807 |
| 2016/0241136 A1 | 8/2016 | Nakashima et al. | |
| 2017/0244335 A1 | 8/2017 | Lim et al. | |

FOREIGN PATENT DOCUMENTS

| JP | 6246051 B2 | 11/2015 |
| JP | 2016-100996 | 5/2016 |
| JP | 2017-011201 | 1/2017 |
| WO | WO 88/04879 | 6/1988 |
| WO | WO 2014/057622 | 4/2014 |

OTHER PUBLICATIONS

Extended European Search Report for corresponding EP Application No. 17936431.0-1203, dated Jul. 6, 2021.

* cited by examiner

US 11,522,443 B2

INVERTER APPARATUS

CROSS-REFERENCE TO RELATED APPLICATIONS

The present application is a continuation application of International Application No. PCT/JP2017/046954, filed Dec. 27, 2017. The contents of this application are incorporated herein by reference in their entirety.

BACKGROUND

Field of the Invention

The embodiments disclosed herein relate to an inverter apparatus.

Discussion of the Background

JP 6-303779A discloses an inverter apparatus to which an EMC (electromagnetic compatibility) filter is externally attached.

In recent years, for consideration as to various equipment environments, there has been a demand for development of inverter apparatuses with EMC filters incorporated in the inverter apparatuses.

SUMMARY

According to one aspect of the present disclosure, an inverter apparatus includes a main circuit substrate, an EMC filter substrate, a control substrate, and a panel. The main circuit substrate is configured to convert electric power and includes an output terminal through which the electric power is output from the inverter apparatus. The EMC filter substrate is provided on the main circuit substrate and configured to reduce propagation of electromagnetic noise. The EMC filter substrate includes a first input terminal through which the electric power is input to the inverter apparatus. The control substrate is provided on the EMC filter substrate so that the EMC filter substrate is sandwiched between the main circuit substrate and the control substrate. The control substrate is configured to control the main circuit substrate. The panel is provided on the control substrate so that the control substrate is sandwiched between the EMC filter substrate and the panel.

BRIEF DESCRIPTION OF THE DRAWINGS

A more complete appreciation of the present disclosure and many of the attendant advantages thereof will be readily obtained as the same becomes better understood by reference to the following detailed description when considered in connection with the accompanying drawings, wherein.

DESCRIPTION OF THE EMBODIMENTS

Figure 1:
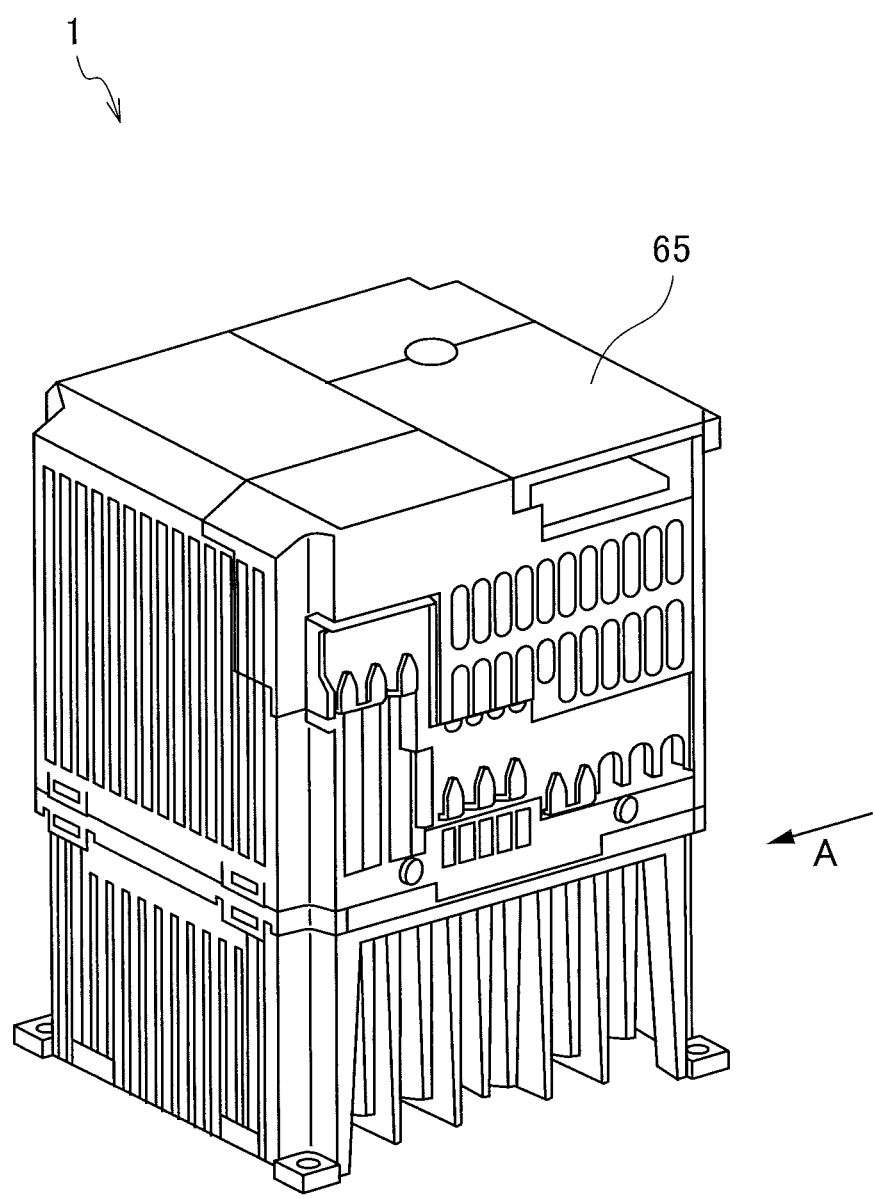
FIG. 1 illustrates a schematic exterior configuration example of an inverter apparatus according to one embodiment.

The embodiments will now be described with reference to the accompanying drawings, wherein like reference numerals designate corresponding or identical elements throughout the various drawings.

An inverter apparatus 1 according to an embodiment of the present disclosure will be described below by referring to FIGS. 1 through 7. As illustrated in FIG. 1, the inverter apparatus 1 according to this embodiment includes a front panel (panel) 65.

Figure 2:
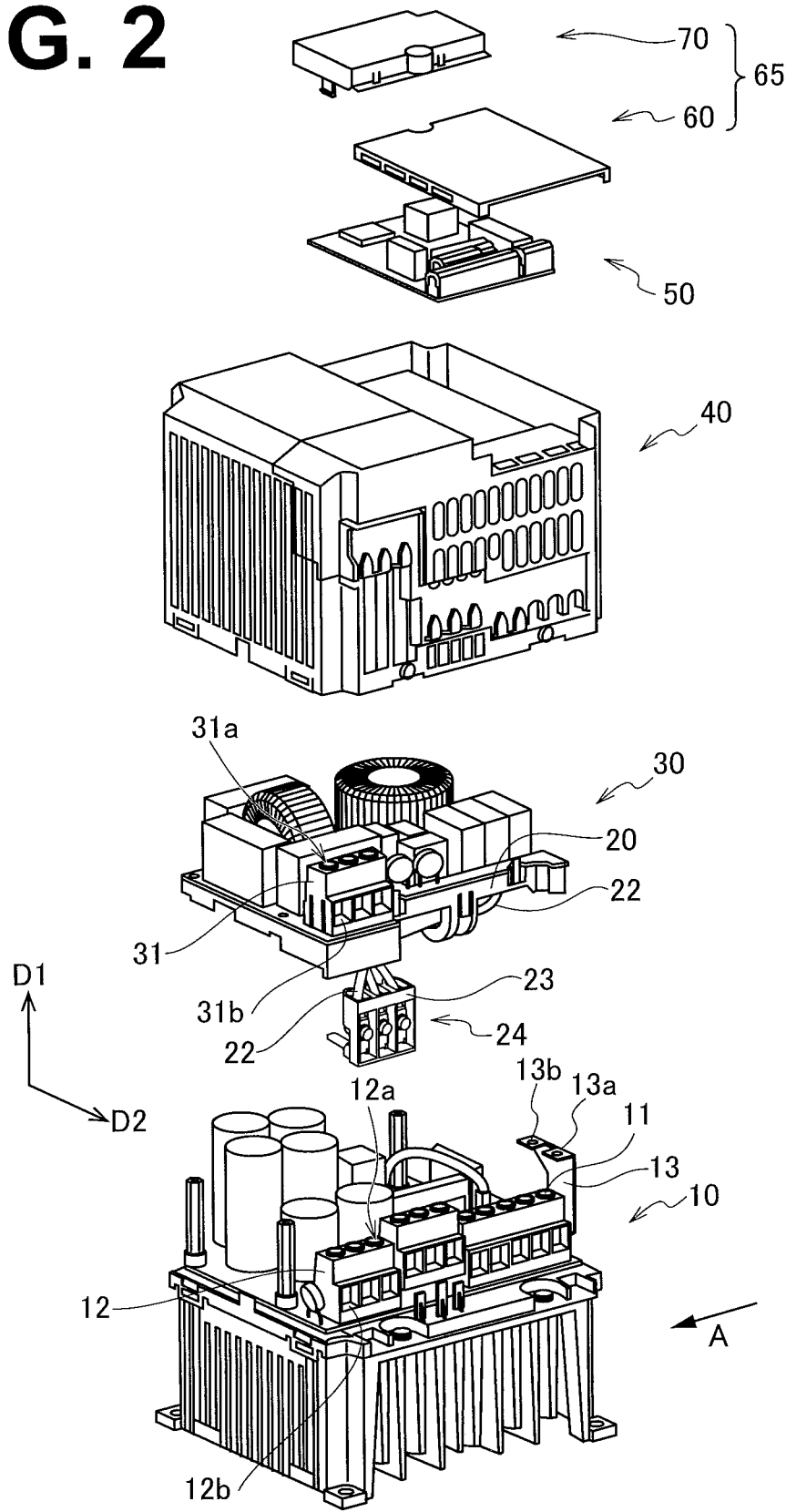
FIG. 2 is an example exploded view of a configuration of the inverter apparatus according to the one embodiment.

As illustrated in FIG. 2, the inverter apparatus 1 according to this embodiment includes, in addition to the front panel 65: a main circuit substrate 10, which performs electric power conversion; an insulation member 20; an EMC filter substrate 30; a cover 40; and a control substrate 50.

As illustrated in FIG. 2, the front panel 65 includes a cover 60 and a manipulator 70. It is to be noted that the configuration of the front panel 65 will not be limited to the configuration illustrated in FIGS. 1 and 2. It is also to be noted that the front panel 65 may not necessarily be provided at a front part of the inverter apparatus 1.

Also, the main circuit substrate 10 may be implemented by: a single substrate; two or more substrates aligned next to each other; or two or more substrates stacked on top of each other.

As illustrated in FIG. 2, the EMC filter substrate 30 is stacked on the surface of the main circuit substrate 10 facing the front panel 65, and serves as an EMC filter that reduces propagation of noise. For example, an EMC core and capacitors such as a film capacitor may be provided on the EMC filter substrate 30.

As illustrated in FIG. 2, the control substrate 50 is stacked on the surface of the EMC filter substrate 30 facing the front panel 65, and controls the main circuit substrate 10.

Incidentally, as illustrated in FIG. 2, an input terminal 31, through which electric power is input into the inverter apparatus 1, is provided on the EMC filter substrate 30; and an output terminal 11, through which electric power is output from the inverter apparatus 1, is provided on the main circuit substrate 10. The input terminal 31 is a non-limiting example of the first input terminal recited in the appended claims.

Thus, the EMC filter substrate 30 is inserted between the control substrate 50 and the main circuit substrate 10. This configuration blocks propagation of noise from the main circuit substrate 10 to the control substrate 50. Example ways of propagation include propagation in the air and propagation through electrical wires.

The above configuration also ensures that a large physical distance is secured between the input terminal 31 and the output terminal 11. This reduces the influence that electromagnetic waves of a line connected to the output terminal 11 have on a line connected to the input terminal 31. As a result, the effect of the EMC filter (that is, reduction of noise from the inverter apparatus 1 toward the system on the input terminal 31 side) further increases.

Also in the above configuration, the control substrate 50 is provided at a part facing the front panel 65. This ensures that accessibility to the control substrate 50 is secured.

Figure 3:
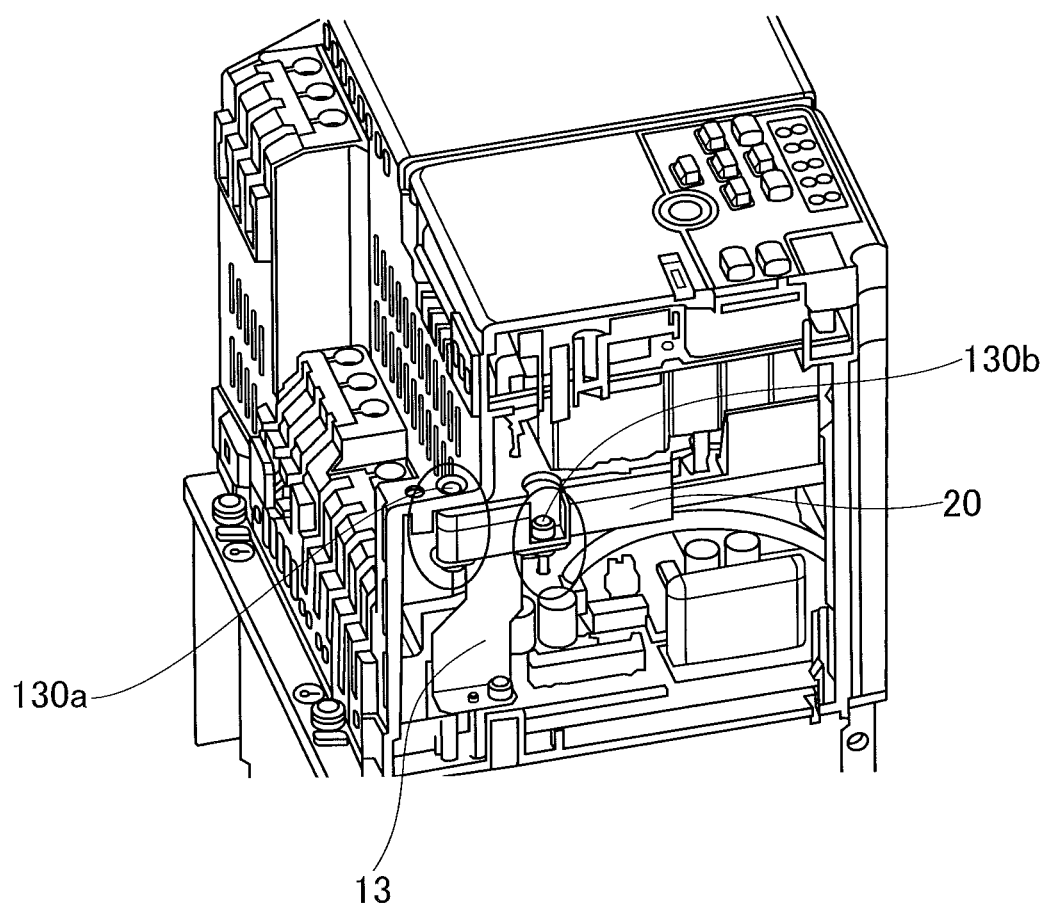
FIG. 3 illustrates an example combination of a main circuit substrate and an EMC filter substrate of the inverter apparatus according to the one embodiment.

As illustrated in FIGS. 2 and 3, the main circuit substrate 10 includes a support plate 13, which supports the EMC filter substrate 30. As illustrated in FIG. 3, the support plate 13 and an earth layer (not illustrated) of the EMC filter substrate 30 may be electrically connected to each other via an earth screw 130a.

This configuration ensures that on the main circuit substrate 10, the support plate 13 serves both as a member that supports the EMC filter substrate 30 and a member that is connected to the earth. The above configuration also ensures that the EMC filter substrate 30 can be deactivated merely by removing the earth screw 130a Also, as illustrated in FIG. 3, the inverter apparatus 1 according to this embodiment may include a fixing screw 130b, which is different from the earth screw 130a and fastens the EMC filter substrate 30 and the support plate 13 to each other.

This configuration ensures that even if the EMC filter substrate 30 is deactivated by removing the earth screw 130a, the EMC filter substrate 30 is kept in an appropriate supported state.

Figure 4:
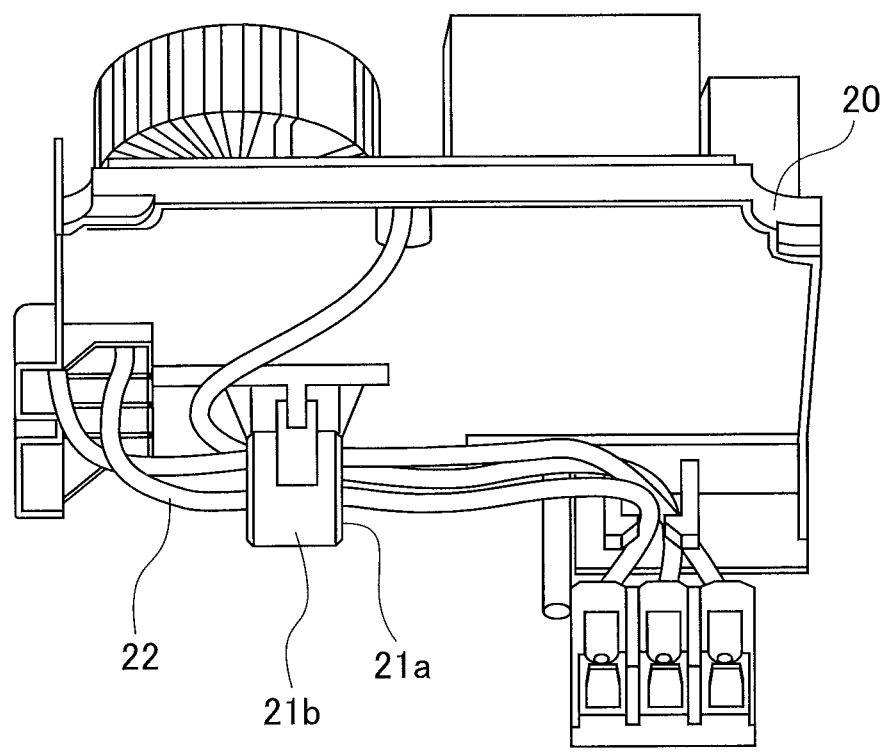
FIG. 4 illustrates an example of the EMC filter substrate of the inverter apparatus according to the one embodiment.

As illustrated in FIGS. 2 and 4, the inverter apparatus 1 according to this embodiment may further include the insulation member 20, which is provided between the main circuit substrate 10 and the EMC filter substrate 30 and supports the EMC filter substrate 30. For example, the insulation member 20 may be made of resin. To the insulation member 20, the EMC filter substrate 30 may be fixed, and the insulation member 20 may be fixed to the main circuit substrate 10 via, for example, a stud that stands upright on the main circuit substrate 10.

Thus, the insulation member 20 is inserted between the main circuit substrate 10 and the EMC filter substrate 30. This configuration ensures that an insulation state is secured between the main circuit substrate 10 and the EMC filter substrate 30 while the EMC filter substrate 30 is supported, and that a large insulation distance is secured, resulting in a reduction in noise.

Figure 5:
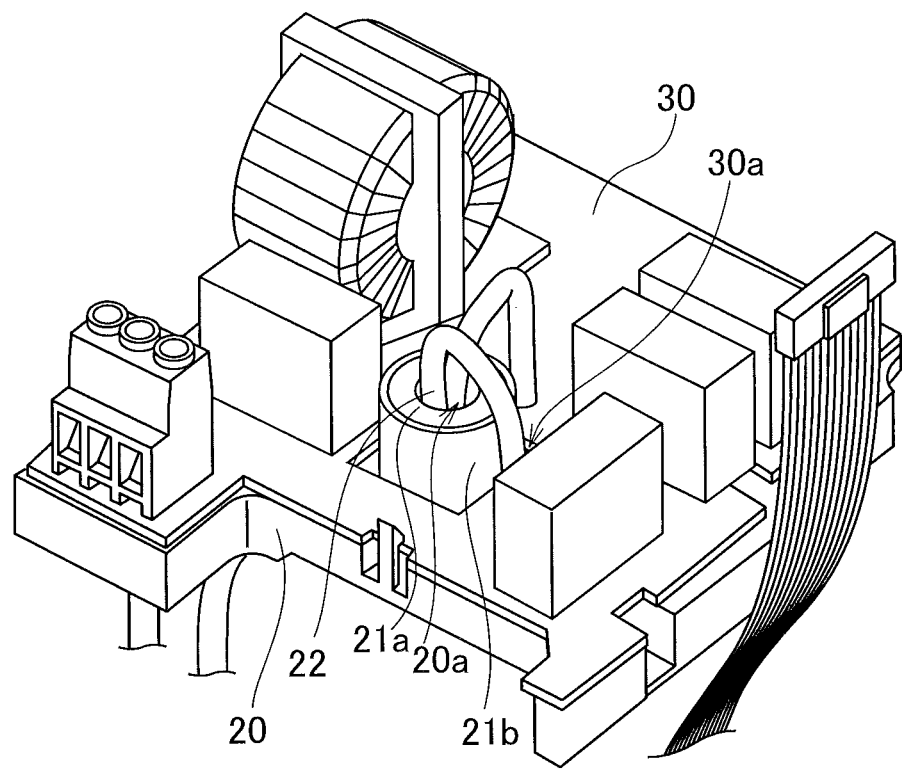
FIG. 5 illustrates an example of the EMC filter substrate of the inverter apparatus according to the one embodiment.

Also, as illustrated in FIGS. 4 and 5, the EMC filter substrate 30, which is included in the inverter apparatus 1 according to this embodiment, may include an EMC core 21a, through which an output electric wire 22 is passed. In this respect, electric power output from the EMC filter substrate 30 is input into the main circuit substrate 10 through the output electric wire 22. It is to be noted that the EMC core 21a may also be referred to as a ring core and is made of, for example, magnetic material. With this configuration, the EMC core 21a is capable of serving a function of removing the noise of the electric wire 22 passing through the EMC core 21a.

FIG. 4 is a perspective view of the EMC filter substrate 30 as seen from the main circuit substrate 10 side, illustrating an example in which the EMC core 21a is installed on the EMC filter substrate 30. In the installment example illustrated in FIG. 4, the EMC core 21a is provided between the main circuit substrate 10 and the EMC filter substrate 30.

This configuration eliminates the need for securing an installment space for the EMC core 21a on the EMC filter substrate 30, making the inverter apparatus 1 smaller in size.

Also, as illustrated in FIGS. 4 and 5, in this embodiment, the insulation member 20 may include a core holder 21b, which holds the EMC core 21a. The core holder 21b may be provided with a claw shaped member to fix the core 21a.

This configuration eliminates the need for providing a core holder 21b that is separate from the insulation member 20, resulting in a reduction in piece-part count. The above configuration also ensures that the path of the core 21a is limited, resulting in improved assembly performance.

For example, as illustrated in FIG. 4, the core holder 21b may be integrally formed with the insulation member 20 on the surface of the main circuit substrate 10 facing the insulation member 20. Thus, the core holder 21b is provided in the space between the insulation member 20 and the main circuit substrate 10. This configuration prevents the inverter apparatus 1 from increasing in size.

FIG. 5 is a perspective view of the EMC filter substrate 30 as seen from the control substrate 50, illustrating another example in which the EMC core 21a is installed on the EMC filter substrate 30. As illustrated in FIG. 5, the EMC core 21a may be provided on the EMC filter substrate 30 on the side of the control substrate 10.

Specifically, as illustrated in FIG. 5, the EMC filter substrate 30 has a through hole 30a, and the insulation member 20 has a through hole 20a. In this configuration, the EMC core 21a, the EMC filter substrate 30, and the insulation member 20 may be arranged such that their through holes (the through hole of the EMC core 21a, the through hole 30a, and the through hole 20a) match each other. Then, the output electric wire 22 passing through the EMC core 21a may pass through the matching through holes and be wired through the EMC filter substrate 30 from the control substrate 50 side to the main circuit substrate 10 side.

Thus, the core holder 21b is provided in and around the through hole 30a and the through hole 20a. This configuration prevents the inverter apparatus 1 from increasing in size.

Figure 6:
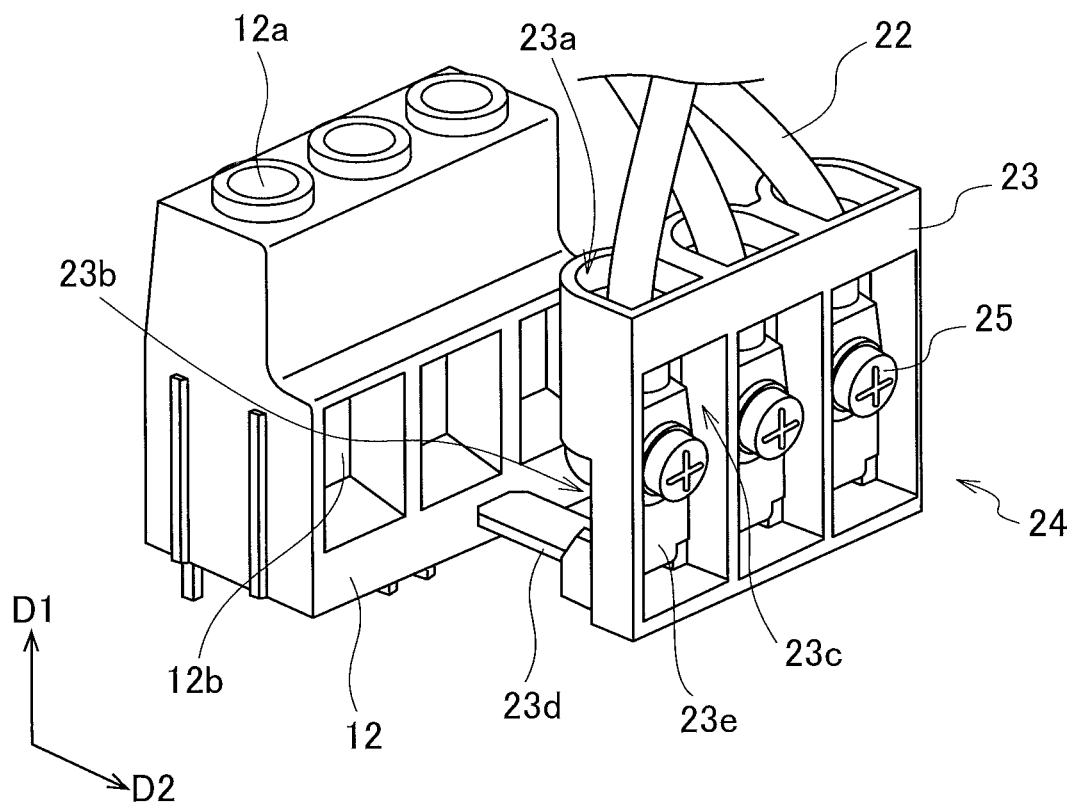
FIG. 6 illustrates an example of a terminal block and a resin case of the inverter apparatus according to the one embodiment.

Also, as illustrated in FIGS. 2 and 6, the inverter apparatus 1 according to this embodiment may further include an input terminal 12, which is provided on the main circuit substrate 10. The input terminal 12 (which is a non-limiting example of the second input terminal recited in the appended claims) is connected with the output electric wire 22, through which electric power is output from the EMC filter substrate 30. Through the input terminal 12, electric power is input into the main circuit substrate 10.

This configuration ensures that the main circuit substrate 10 can be made a common main circuit substrate, realizing a component commonization in which the main circuit substrate 10 is shared with an inverter apparatus that is not provided with the EMC filter substrate 30.

Specifically, in an inverter apparatus in which no EMC filter substrate 30 exists, it is possible to: decrease the dimension of the inverter apparatus 1 in the direction of D1, which is made possible by the omission of the EMC filter substrate 30 illustrated in FIG. 2; and make the input terminal 12 of the main circuit substrate 10 serve as the input terminal 31 of the inverter apparatus 1 itself. In this manner, a component commonization can be realized.

In this embodiment, the input terminal 31 includes electric wire insertion openings 31a, through which three electric wires are insertable; and the input terminal 12 includes electric wire insertion openings 12a, through which three electric wires are insertable. Also in this embodiment, the output terminal 11 includes electric wire insertion openings through which five electric wires are insertable. It is to be noted, however, that the electric wire insertion openings will not be limited to the above-described numbers.

Also in this embodiment, the input terminal 31 may be implemented in the form of an electric-wire press-fit connection terminal block having the electric wire insertion openings 31a (first electric wire insertion openings), through which electric wires are insertable. Also, the input terminal 12 may be implemented in the form of an electric-wire press-fit connection terminal block having the electric wire insertion openings 12a (second electric wire insertion openings), through which electric wires are insertable.

In this respect, the electric wire insertion openings 31a, which are included in the input terminal 31, and the electric wire insertion openings 12a, which are included in the input terminal 12, may be open in the direction D1, in which the EMC filter substrate 30 is stacked; or may be open in a same direction different from the direction D1, in which the EMC filter substrate 30 is stacked (for example, in the direction of D2 illustrated in FIG. 2).

This configuration ensures that an input terminal of an inverter apparatus in which no EMC filter substrate 30 exists (the input terminal 12 of the main circuit substrate 10) and an input terminal of the inverter apparatus 1, in which the EMC filter substrate 30 exists (the input terminal 31 of the EMC filter substrate 30), have identical configurations and are orientated in the same direction. This ensures that a component commonization of the main circuit substrate 10 is realized, commonizing the usability of the two kinds of inverter apparatuses.

It is to be noted that as illustrated in FIG. 2, the input terminal 31 and the input terminal 12, which have electric-wire press-fit connection terminal block forms, respectively include insertion holes 31b and insertion holes 12b, which are open in the direction D2. By inserting a tool, such as a flathead screwdriver, into the insertion holes 31b and the insertion holes 12b, it is possible to release the fastening of the electric wires inserted through the electric wire insertion openings 31a and the electric wire insertion openings 12a.

Figure 7:
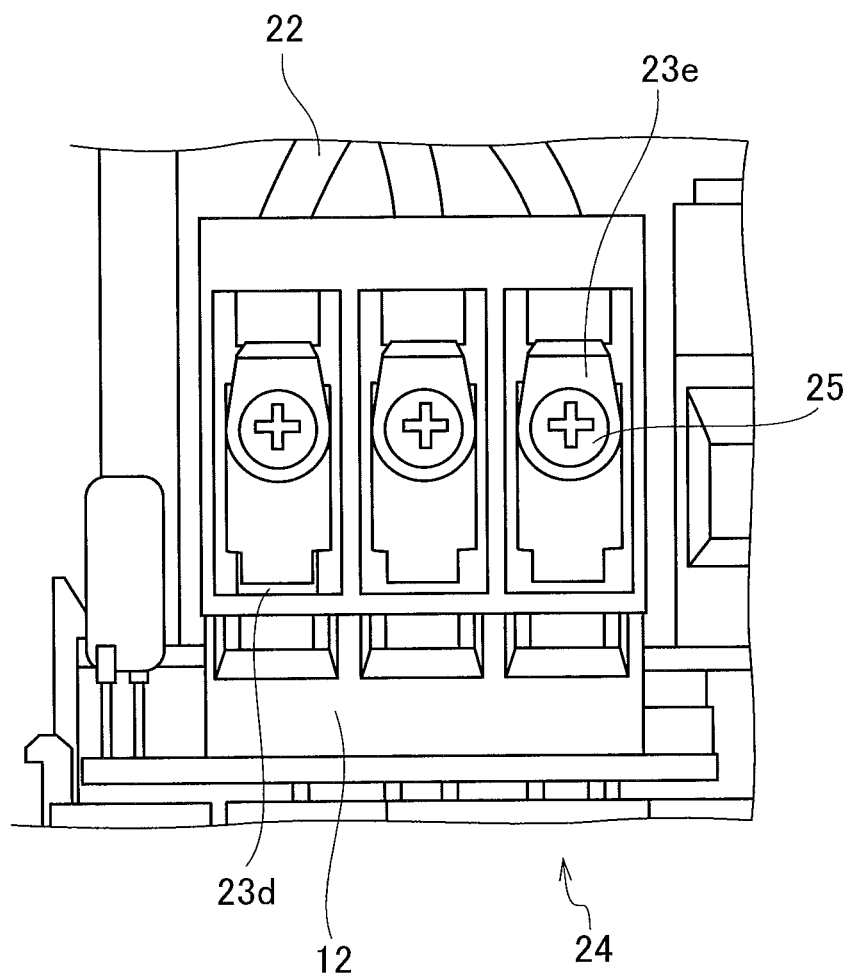
FIG. 7 illustrates an example in which the terminal block and the resin case of the inverter apparatus according to the one embodiment is fixed.

Also in this embodiment, as illustrated in FIGS. 6 and 7, the inverter apparatus 1 according to this embodiment may further include a terminal 24, which includes a resin case 23. The terminal 24 includes: insertion-hole inserted portions 23d, which are inserted in the respective insertion holes 12b; and extension portions 23e, which extend from the respective insertion-hole inserted portions 23d along a direction toward the EMC filter substrate 30. In this respect, the insertion-hole inserted portions 23d and the extension portions 23e may be made of, for example, electric conduction material, and may be part of the terminal 24.

The output electric wire 22 is made of an electric conduction material covered with an insulation material, and connects the EMC filter substrate 30 and the main circuit substrate 10 to each other.

This configuration ensures that the output electric wire 22 is produced with ease with the length of the output electric wire 22 made smaller in the direction D2, realizing a smaller size configuration of the inverter apparatus 1.

Also, as illustrated in FIG. 6, the terminal 24 includes a first opening 23a, a second opening 23b, and a third opening 23c.

As illustrated in FIG. 6, the first opening 23a is open toward the front panel 65 (along the direction toward D1); the second opening 23b is open toward the input terminal 12; and the third opening 23c is open along a direction away from the input terminal 12.

As illustrated in FIG. 6, in the terminal 24, the insertion-hole inserted portions 23d protrudes from the second opening 23b so that the output electric wire 22 passing through the first opening 23a and fixed to the terminal 24 by a screw 25 and/or an associated member is electrically connected to the input terminal 12.

The insertion-hole inserted portions 23d are inserted into the respective insertion holes 12a (second insertion holes) of the input terminal 12. This ensures that the electric power from the EMC filter substrate 30 is supplied to the main circuit substrate 10 through the output electric wire 22.

Specifically, the output electric wire 22 is inserted through the first opening 23a and electrically connected to the input terminal 12 through the second opening 23b. In this respect, the output electric wire 22 is fixed to the terminal 24 by the screw 25 and/or an associated member screwed from the third opening 23c side.

This configuration ensures that a plurality of output electric wires 22 are collectively insulated by the resin case 23, enabling the electric wires 22 to be appropriately wired in a small area of space in the inverter apparatus 1.

The inverter apparatus 1 according to the embodiment of the present disclosure sufficiently blocks propagation of electromagnetic noise from the output terminal 11 to the input terminal 31 while minimizing an increase in cost.

In the present disclosure, the term "comprise" and its variations are intended to mean open-ended terms, not excluding any other elements and/or components that are not recited herein. The same applies to the terms "include", "have", and their variations.

In the present disclosure, a component suffixed with a term such as "member", "portion", "part", "element", "body", and "structure" is intended to mean that there is a single such component or a plurality of such components.

In the present disclosure, ordinal terms such as "first" and "second" are merely used for distinguishing purposes and there is no other intention (such as to connote a particular order) in using ordinal terms. For example, the mere use of "first element" does not connote the existence of "second element"; otherwise, the mere use of "second element" does not connote the existence of "first element".

In the present disclosure, approximating language such as "approximately", "about", and "substantially" may be applied to modify any quantitative representation that could permissibly vary without a significant change in the final result obtained. All of the quantitative representations recited in the present application shall be construed to be modified by approximating language such as "approximately", "about", and "substantially".

In the present disclosure, the phrase "at least one of A and B" is intended to be interpreted as "only A", "only B", or "both A and B".

Obviously, numerous modifications and variations of the present disclosure are possible in light of the above teachings. It is therefore to be understood that within the scope of the appended claims, the present disclosure may be practiced otherwise than as specifically described herein.

What is claimed as new and desired to be secured by Letters Patent of the United States is:

1. An inverter apparatus comprising:
   a main circuit substrate configured to convert electric power and comprising an output terminal through which the electric power is output from the inverter apparatus;
   an electromagnetic compatibility (EMC) filter substrate provided on the main circuit substrate, the EMC filter substrate being configured to reduce propagation of electromagnetic noise and comprising a first input terminal through which the electric power is input to the inverter apparatus;
   a control substrate provided on the EMC filter substrate so that the EMC filter substrate is sandwiched between the main circuit substrate and the control substrate, the control substrate being configured to control the main circuit substrate; and a panel provided on the control substrate so that the control substrate is sandwiched between the EMC filter substrate and the panel, wherein the main circuit substrate comprises a support plate supporting the EMC filter substrate, and wherein the EMC filter substrate includes an earth layer which is electrically connected to the support plate via an earth screw, and further comprising: a fixing screw which fastens the EMC filter substrate and the support plate to each other.

2. The inverter apparatus according to claim 1, further comprising:

an insulation member provided between the main circuit substrate and the EMC filter substrate to support the EMC filter substrate.

3. The inverter apparatus according to claim 1, further comprising:

an output electric wire through which the electric power is output from the EMC filter substrate to the main circuit substrate; and an EMC core that is provided on a surface of the EMC filter substrate facing the control substrate and that has a through hole through which the output electric wire passes, wherein the EMC filter substrate has a through hole, and wherein the EMC core and the EMC filter substrate are arranged with the through hole of the EMC core and the through hole of the EMC filter substrate matching each other.

4. The inverter apparatus according to claim 1, further comprising:

a second input terminal which is provided on the main circuit substrate; to which an electric wire through which the electric power is output from the EMC filter substrate to the main circuit substrate is connected; and through which the electric power is input into the main circuit substrate.

5. The inverter apparatus according to claim 2, further comprising:

an output electric wire through which the electric power is output from the EMC filter substrate to the main circuit substrate; and an EMC core which is provided between the main circuit substrate and the EMC filter substrate and through which the output electric wire is passed.

6. The inverter apparatus according to claim 3, further comprising:

a second input terminal which is provided on the main circuit substrate; to which an electric wire through which the electric power is output from the EMC filter substrate to the main circuit substrate is connected; and through which the electric power is input into the main circuit substrate.

7. The inverter apparatus according to claim 4, wherein the first input terminal and the second input terminal each comprise an electric-wire press-fit connection terminal block having a first electric wire insertion opening and a second electric wire insertion opening through which an electric wire is inserted, and wherein the first electric wire insertion opening and the second electric wire insertion opening are open along a direction in which the EMC filter substrate is stacked.

8. The inverter apparatus according to claim 5, wherein the insulation member comprises a core holder holding the EMC core and integrally formed with the insulation member on a surface of the insulation member facing the main circuit substrate.

9. The inverter apparatus according to claim 7, further comprising:

a terminal comprising a resin case, the resin case comprising:

an insertion-hole inserted portion inserted in an insertion hole provided in the second input terminal; and an extension portion extending from the insertion-hole inserted portion along a direction toward the EMC filter substrate, wherein the output electric wire connects the EMC filter substrate and the main circuit substrate to each other.

10. The inverter apparatus according to claim 7, further comprising:

a terminal comprising a resin case, the resin case comprising:

a first opening open toward the panel; and a second opening open toward the second input terminal, wherein the output electric wire is inserted through the first opening and electrically connected to the second input terminal through the second opening.

11. An inverter apparatus comprising:

a main circuit substrate configured to convert electric power and comprising an output terminal through which the electric power is output from the inverter apparatus;

an electromagnetic compatibility (EMC) filter substrate provided on the main circuit substrate, the EMC filter substrate being configured to reduce propagation of electromagnetic noise and comprising a first input terminal through which the electric power is input to the inverter apparatus;

a control substrate provided on the EMC filter substrate so that the EMC filter substrate is sandwiched between the main circuit substrate and the control substrate, the control substrate being configured to control the main circuit substrate;

a panel provided on the control substrate so that the control substrate is sandwiched between the EMC filter substrate and the panel;

an output electric wire through which the electric power is output from the EMC filter substrate to the main circuit substrate; and an EMC core that is provided on a surface of the EMC filter substrate facing the control substrate and that has a through hole through which the output electric wire passes, wherein the EMC filter substrate has a through hole, and wherein the EMC core and the EMC filter substrate are arranged with the through hole of the EMC core and the through hole of the EMC filter substrate matching each other.

12. An inverter apparatus comprising:

a main circuit substrate configured to convert electric power and comprising an output terminal through which the electric power is output from the inverter apparatus;

an electromagnetic compatibility (EMC) filter substrate provided on the main circuit substrate, the EMC filter substrate being configured to reduce propagation of electromagnetic noise and comprising a first input terminal through which the electric power is input to the inverter apparatus;

a control substrate provided on the EMC filter substrate so that the EMC filter substrate is sandwiched between the main circuit substrate and the control substrate, the control substrate being configured to control the main circuit substrate;

a panel provided on the control substrate so that the control substrate is sandwiched between the EMC filter substrate and the panel; and a second input terminal which is provided on the main circuit substrate; to which an electric wire through which the electric power is output from the EMC filter substrate to the main circuit substrate is connected; and through which the electric power is input into the main circuit substrate.

\* \* \* \* \*